United States Patent
Berkhout et al.

(10) Patent No.: US 8,081,022 B2
(45) Date of Patent: Dec. 20, 2011

(54) DATA PROCESSING SYSTEM FOR CLIPPING CORRECTION

(75) Inventors: Marco Berkhout, Tiel (NL); Benno Krabbenborg, Arnhem (NL)

(73) Assignee: NXP B.V., Eindhoven (NL)

( * ) Notice: Subject to any disclaimer, the term of this patent is extended or adjusted under 35 U.S.C. 154(b) by 102 days.

(21) Appl. No.: 12/530,268

(22) PCT Filed: Mar. 11, 2008

(86) PCT No.: PCT/IB2008/050879
§ 371 (c)(1),
(2), (4) Date: Sep. 8, 2009

(87) PCT Pub. No.: WO2008/110987
PCT Pub. Date: Sep. 18, 2008

(65) Prior Publication Data
US 2010/0045356 A1    Feb. 25, 2010

(30) Foreign Application Priority Data

Mar. 14, 2007  (EP) .................................. 07005254
Mar. 11, 2008  (WO) ................. PCT/IB2008/050879

(51) Int. Cl.
*H03K 3/017*  (2006.01)
*H03K 5/04*   (2006.01)
*H03K 7/08*   (2006.01)

(52) U.S. Cl. ........................ 327/172; 327/108; 330/10

(58) Field of Classification Search .................. 327/108, 327/172; 330/10
See application file for complete search history.

(56) References Cited

U.S. PATENT DOCUMENTS

| | | | |
|---|---|---|---|
| 6,300,825 B1 * | 10/2001 | Dijkmans et al. | ............... 330/10 |
| 6,384,678 B2 * | 5/2002  | Berkhout        | ........................ 330/10 |
| 6,577,186 B2 * | 6/2003  | Berkhout        | ........................ 330/10 |
| 7,038,535 B2 * | 5/2006  | Lee             | ................... 330/10 |
| 2004/0036529 A1 | 2/2004 | Tsuji et al. | |
| 2005/0083114 A1 | 4/2005 | Risbo | |
| 2006/0008095 A1 | 1/2006 | Tsuji | |
| 2006/0097784 A1 | 5/2006 | Lind | |

FOREIGN PATENT DOCUMENTS

JP    2006 050589 A    2/2006

OTHER PUBLICATIONS

Berkhout, Marco; "An Integrated 200-W Class-D Audio Amplifier", IEEE Journal of Solid State Circuits; vol. 38, No. 7; Jul. 2003; pp. 1198-1206.

* cited by examiner

*Primary Examiner* — Lincoln Donovan
*Assistant Examiner* — John Poos

(57) ABSTRACT

A device (100) for processing data, the device (100) comprising an integrator unit (103, 104) adapted for integrating an input signal ($V_1$) and a correction unit (101, 102) adapted for correcting a clipping integrator unit (103, 104) by forcing a zero-crossing of an output signal ($V_1, V_2$) of the integrator unit (103, 104).

19 Claims, 5 Drawing Sheets

DATA PROCESSING SYSTEM FOR CLIPPING CORRECTION

FIELD OF THE INVENTION

The invention relates to a device for processing data.

Moreover, the invention relates to method of processing data.

Beyond this, the invention relates to a program element.

Further, the invention relates to a computer-readable medium.

BACKGROUND OF THE INVENTION

In electronics, amplifiers may be required as a device for converting an input signal to an output signal having an altered amplitude. For instance, such amplifiers may be implemented in audio devices.

Clipping phenomena may be disturbing in amplifiers, particularly in class D audio amplifiers.

US 2005/0083114 A1 discloses a class D audio amplifier system with recovery from clipping events. The amplifier system includes multiple audio channels, each of which can be constructed to include a pulse-width-modulator. The PWM modulator includes a pair of comparators that generate complementary PWM output signals based upon the comparison between a filtered difference signal and a reference waveform. Clip detection logic is provided to detect clipping at the output of the channel, preferably by detecting successive edges of the reference waveform without an intervening edge of a PWM output signal. In response to detecting clipping, a first integrator is reset to remove residuals and to eliminate the first integrator from the loop filter of the modulator. A saturation level circuit applies a clamping voltage in both clipping and non-clipping situations to a second integrator. As a result, the loop filter shall be prevented from entering extreme conditions during clipping, which shall reduce the clipping recovery time.

US 2006/0008095 A1 discloses a pulse-width modulation (PWM) amplifier adapted to a class-D amplifier in which an analog input signal is subjected to integration, pulse-width modulation, and switched amplification, wherein a glitch elimination circuit eliminates noise from a pulse-width modulated signal, from which a high pulse signal and a low pulse signal are isolated such that each pulse is delayed by a dead time at the leading-edge timing thereof. When both of them are simultaneously set to a high level, one of them is reduced in level. In response to the occurrence of clipping, an integration constant applied to an operational amplifier is automatically changed from a primary integration constant to a secondary integration constant. When the clipped state is sustained for a prescribed time, an inversion pulse is compulsorily introduced into the pulse-width modulated signal.

However, conventional clipping suppression procedures may be complex and may lack reliability.

OBJECT AND SUMMARY OF THE INVENTION

It is an object of the invention to enable suppression of clipping effects in data processing.

In order to achieve the object defined above, a device for processing data, a method of processing data, a program element and a computer readable medium according to the independent claims are provided.

According to an exemplary embodiment of the invention, a device for processing data operating in accordance with a clock cycle is provided, the device comprising an integrator unit adapted for integrating an input signal and a correction unit adapted for correcting a clipping integrator unit by forcing a zero-crossing of an output signal of the integrator unit during each clock cycle.

According to another exemplary embodiment of the invention, a method of processing data in accordance with a clock cycle is provided, the method comprising integrating an input signal by an integrator unit, detecting clipping of the integrator unit, and correcting a clipping integrator unit by forcing a zero-crossing of an output signal of the integrator unit during each clock cycle.

According to still another exemplary embodiment of the invention, a program element (for instance an item of a software library, in source code or in executable code) is provided, which, when being executed by a processor, is adapted to control or carry out a data processing method having the above mentioned features.

According to yet another exemplary embodiment of the invention, a computer-readable medium (for instance a CD, a DVD, a USB stick, a floppy disk or a harddisk) is provided, in which a computer program is stored which, when being executed by a processor, is adapted to control or carry out a data processing method having the above mentioned features.

The data processing scheme according to embodiments of the invention can be realized by a computer program, that is by software, or by using one or more special electronic optimization circuits, that is in hardware, or in hybrid form, that is by means of software components and hardware components.

The term "clipping" may particularly denote a behavior of an electronic circuit such as an amplifier or an analog to digital converting unit which may occur when a full scale range of processible amplitudes is exceeded. In case of such an overflow, proper data processing may be disturbed for some time until clipping recovery has occurred.

The term "class D amplifier" may denote an audio amplifier realized as a switching amplifier or a PWM (Pulse Width Modulation) amplifier. In such a type of amplifier, the switches may be either fully on or fully off, significantly reducing the power losses in the output devices. The audio signal may be used to modulate a PWM carrier signal, which drives the output devices, with a last processing stage being a low pass filter to remove the high-frequency pulse width modulation carrier frequency. A switching amplifier or class D amplifier may therefore be a power amplifier where the active devices (especially in the output stage) are operated in on/off mode (that is to say a switch). The term "class D" may mean "digital" amplifier.

According to an exemplary embodiment of the invention, an electronic circuit may be provided allowing to suppress disturbing clipping artefacts by correcting clipping output signals in an integrator by ensuring that the output signal of the integrator unit performs a zero-crossing sufficiently frequently, for instance during each clock cycle. By taking this measure, disturbing drifts of integrators may be reliably prevented, thereby improving clip recovery behaviour.

According to an exemplary embodiment of the invention, improved clipping control in class D amplifiers may be made possible. Particularly, a class D amplifier may be provided having an integrating feedback loop with improved clipping recovery behavior. The integrators may be prevented from diverging by forcing a zero-crossing during each clock cycle. This can be done by injecting a current pulse in a virtual ground node of an integrator and/or by manipulating edges of a reference clock signal present on an input of an integrator.

Many Class-D amplifiers use an integrating feedback loop to provide power supply rejection and correction of switching errors in the output stage. Clipping may occur when the magnitude of the current from an input voltage-to-current converter exceeds a magnitude of a current being fed back to an integrator through a feedback loop, which may include a feedback resistor. It may take some time for feedback signals to return to steady-state, and also the loop may need some time to settle. This may results in a 'sticking' behavior at the output followed by a second order response. Such clipping recovery behavior may be considered ugly from the point of view of proper data processing or may be even audible. When integrators in the feedback loop drift away, the voltage across capacitors of the integrators may be uncontrolled, and this can be disturbing if for example sensible gate-oxide capacitors are used (measures such as voltage clamps would then be needed to protect the capacitors from damage.).

According to an exemplary embodiment of the invention, a switching amplifier circuit may be provided, the switching amplifier circuit comprising a feedback loop having at least one integrator and switching means adapted to force a zero-crossing of the output of each integrator during each clock cycle.

An integrating feedback loop may be used to provide error correction in class-D amplifiers. When the amplifier output is driven into clipping, the integrators in the loop may tend to drift away from their steady-state. Embodiments of the invention may detect this situation and may prevent the integrators from drifting away, thereby improving clipping recovery behavior.

Next, further exemplary embodiments of the device will be explained. However, these embodiments also apply to the method, to the program element and to the computer-readable medium.

The clipping correction unit may be adapted for correcting the clipping integrator unit (or clipping signals) by injecting a current pulse into a virtual ground node of the integrator unit. By such a current injection with a controllable duration and/or amplitude, clipping artifacts may be efficiently suppressed.

More particularly, such a correction unit may comprise a first switchable current source to be switchably coupled to the virtual ground node of the integrator unit and may be adapted for forcing the integrator unit up to a zero value when a feedback loop is clipping to a low side. Furthermore, the correction unit may comprise a second switchable current source to be switchably coupled to the virtual ground node of the integrator unit and may be adapted for forcing the integrator unit down to the zero value when the feedback loop is clipping to a high side. By such double side current-correction architecture, the clipping may be suppressed in both directions, wherein a corresponding control signal may operate a switch (such as a field effect transistor) so that, at each time, none or one of the switched current sources may be coupled to the virtual ground node of the integrator.

The device may further comprise a zero-crossing detector adapted for detecting the zero-crossing of the output signal of the integrator unit and for controlling the first switchable current source and/or the second switchable current source in response to the detection of the zero-crossing. Particularly, such a zero-crossing detector may be a comparator comparing a reference signal with an output of the integrator unit, wherein an output characteristic of such a comparator may be used for controlling the switchable current sources. This may allow to accurately control the switches to perform efficient clipping equilibration.

The correction unit may be adapted for correcting the clipping integrator unit by adjusting or manipulating a clock signal provided to the integrator unit. More particularly, such a correction may be realized in form of a delay of an edge, particularly of a falling edge, of the clock signal provided to an input of the integrator unit. Therefore, by selectively manipulating the clock signal, clipping effects may be efficiently suppressed.

According to an exemplary embodiment, the integrator may comprise a first integrator and a second integrator, and the correction unit may comprise a first corrector and a second corrector. The first corrector may be adapted for correcting the clipping first integrator by injecting a current pulse in a virtual ground node of the first integrator. The second corrector may be adapted for correcting the clipping second integrator by adjusting a clock signal provided to the second integrator. Therefore, the current pulse injection and the clock signal adjustment implementation may be synergetically combined particularly for use in a class D amplifier to avoid disturbing clipping.

The device may comprise a signal processing unit adapted for processing an output signal of the first integrator and an output signal of the second integrator to generate a global (amplified) output signal to be fed back to the first integrator (and/or to the second integrator). By taking this measure, a feedback loop architecture may be achieved in which an output signal is coupled back particularly to a virtual ground node of the first integrator, thereby allowing to improve signal processing quality by getting rid of clipping artefacts.

A clipping detection unit may be provided and adapted for detecting clipping of the integrator unit. When such a clipping has been detected, corresponding control signals may be generated to perform measures to force a zero-crossing of the output signals of the integrator(s). The clipping detection unit may be a logic circuitry detecting clipping based on a characteristic relationship between a clock signal and a global output signal (see FIG. 10).

The device may be adapted as an audio amplifier, particularly as a class D amplifier. However, the device may also be an analog to digital converter. In both such kinds of devices, clipping effects may occur which may deteriorate the quality of the signal processing. By eliminating clipping artifacts, the quality of signal processing may be improved.

The device for processing audio data may be realized as at least one of the group consisting of an audio surround system, a mobile phone, a headset, a loudspeaker, a hearing aid, a television device, a video recorder, a monitor, a gaming device, a laptop, an audio player, a DVD player, a CD player, a harddisk-based media player, an internet radio device, a public entertainment device, an MP3 player, a hi-fi system, a vehicle entertainment device, a car entertainment device, a medical communication system, a body-worn device, a speech communication device, a home cinema system, a home theater system, a flat television, an ambiance creation device, a subwoofer, and a music hall system. Other applications are possible as well.

However, although a system according to an embodiment of the invention intends to improve the quality of sound or audio data, it is also possible to apply the system for a combination of audio data and visual data. For instance, an embodiment of the invention may be implemented in audio-visual applications like a video player or a home cinema system in which one or more speakers are used.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DESCRIPTION OF EMBODIMENTS

Figure 1:
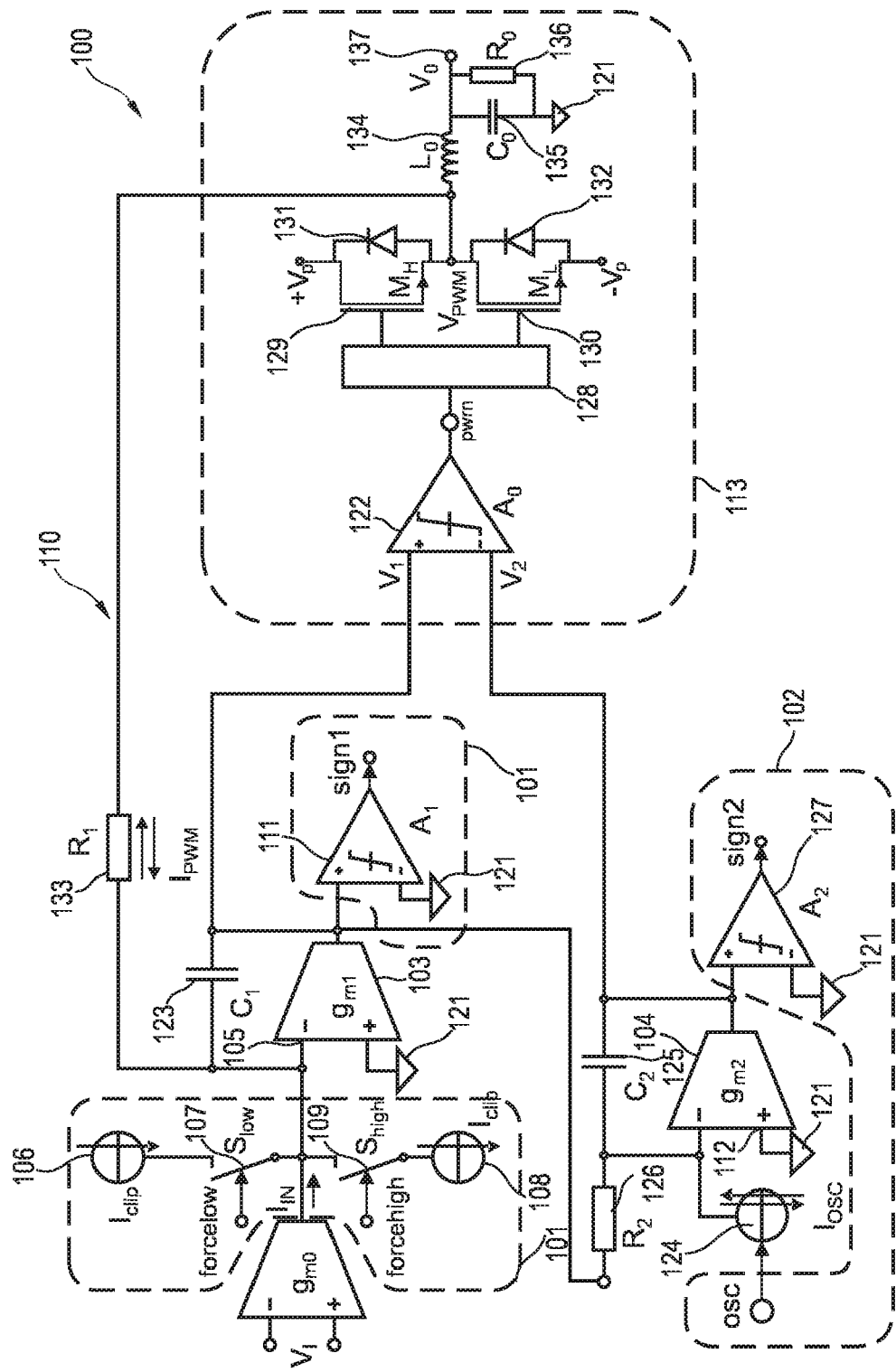
FIG. 1 illustrates an audio data processing device according to an exemplary embodiment of the invention.

The illustration in the drawing is schematical. In different drawings, similar or identical elements are provided with the same reference signs.

In the following, referring to FIG. 1, a device 100 for processing data according to an exemplary embodiment of the invention will be explained.

An input voltage signal $V_I$ is supplied to a voltage-to-current converter unit 120. At an output of the voltage-to-current converter 120, a current signal $I_{IN}$ is provided. This signal $I_{IN}$ is supplied to a virtual ground node 105 of a first integrator 103. A second input of the integrator 103 is coupled to a reference potential 121 such as a ground potential.

Furthermore, a first switch (for instance a transistor) 107 is provided which is also coupled to an output of the voltage-to-current converter unit 120. A second switch 109 is provided which is coupled as well to the output of the voltage-to-current converter unit 120. The switch 107 bridges an electronic path between the output of the voltage-to-current converter unit 120 and a first switched current source 106. In a similar manner, the second switch 109 is connected between the output of the voltage-to-current converter unit 120 and a second switched current source 108.

An output of the first integrator 103 is coupled to a first input of a comparator unit 111. A second input of the comparator unit 111 is coupled to the reference potential 121. At an output of the comparator unit 111, a control signal sign1 is provided.

At an output of the first integrator 103, a first output signal $V_1$ is provided which is supplied to a first input of a comparator 122. Furthermore, between the virtual ground node 105 and the output of the first integrator 103, a capacitance 123 is connected.

An oscillation signal osc is supplied to a controllable current source 124. At an output of the controllable current source 124, a signal $I_{osc}$ is provided which is supplied to an input node 112 of a second integrator 104. A second input of the second integrator 104 is brought to the reference potential 121. An output signal $V_2$ of the second integrator unit 104 is supplied to a second input of the comparator 122. Furthermore, a capacitance 125 is connected between the output of the second integrator 104 and the first input of the second integrator 104. Beyond this, an ohmic resistor 126 is provided. Moreover, an output of the first integrator 103 is coupled to the resistor 126.

A comparator 127 is provided having a first input to which an output signal of the second integrator 104 is supplied. To a second input of the comparator 127, the ground potential 121 is applied. At an output of the comparator 127, a signal sign2 is provided.

The comparator 122 compares the input signals $V_1$ and $V_2$ to generate an output signal pwm. This is supplied to a switch control unit 128. At a first output of the switch control unit 128, a first signal is provided which is supplied to a gate of a first transistor 129. An output signal provided at a second output of the switch control unit 128 is supplied to a gate of a second transistor 130. A first source/drain region of the first capacitor 129 is brought to a potential $+V_p$. A second source/drain region of the transistor 129 is coupled to a first source/drain region of the second transistor 130 and is coupled to the first source/drain region of the first transistor 129 via a first diode 131. A second diode 132 is connected between the first source/drain region and a second source/drain region of the second transistor 130. The second source/drain region of the second transistor 130 is brought to a potential $-V_p$.

The second source/drain region of the first FET 129 and the first source/drain region of the second FET 130 are coupled via a feedback resistor 133 to the virtual ground node 105 of the first integrator 103. The resistor 133 is coupled in a feedback loop 110.

The voltage $V_{PMW}$ is also applied to an inductance 134 which forms, together with a capacitance 135, a low pass filter. The capacitance 135 is connected between the reference potential 121 and the inductance 134. Furthermore, a resistor 136 (which may actually be a loudspeaker represented as a resistive load) is coupled between a global output node 137 at which an output signal $V_O$ is provided and the reference potential 121 on the other hand.

In the following, operation of the device 100 according to the exemplary embodiment of the invention will be explained.

The device 100 is adapted for processing the signal $V_1$ and operates in accordance with a clock cycle defined by the clock signal osc. An integrator block 103, 104 is adapted for signal integration. The correctors 101, 102 are adapted for correcting clipping of signals of the integrators 103, 104 by forcing a zero-crossing of output signals $V_1$ or $V_2$ of the integrators 103 or 104 during each clock cycle.

More particularly, the correction unit 101 is adapted for correcting the clipping integrator unit 103 by injecting a current pulse $I_{clip}$ in the virtual ground node 105 of the integrator unit 103. The correction unit 101 comprises for this purpose the first switchable current source 106 (switchable via the switch 107) to be switchably coupled to the virtual ground node 105 of the integrator unit 103. Furthermore, the correction unit 101 is adapted for forcing the integrator unit 103 up to a zero value when a feedback loop 110 is clipping to a low side. In a similar manner, the correction unit 101 comprises the second switchable current source 108 (switchable via the second switch 109) to be switchably coupled to the virtual ground node 105 of the integrator unit 103. The correction unit 101 is adapted for forcing the integrator unit 103 down to the zero value when the feedback loop 110 is clipping to a high side.

The zero-crossing detector 111 is adapted for detecting the zero-crossing of the output signal $V_1$ of the integrator unit 103 and for controlling the first switchable current source 106/the second switchable current source 108 in response to the detection of the zero-crossing.

Moreover, the correction unit 102 is adapted for correcting clipping of the integrator 104 by adjusting a clock signal $I_{osc}$ provided by the integrator 104. The correction unit 102 may correct the clipping integrator unit 104 by delaying an edge of the clock signal $I_{osc}$ provided to an input 112 of the integrator unit 104.

The signal processing unit 113 is adapted for processing the output signal $V_1$ of the first integrator 103 and the output signal $V_2$ of the second integrator 104 to generate a global output signal $V_{PWM}$ or $V_O$ to be fed back via the feedback line 110 to the first integrator 103.

Figure 10:
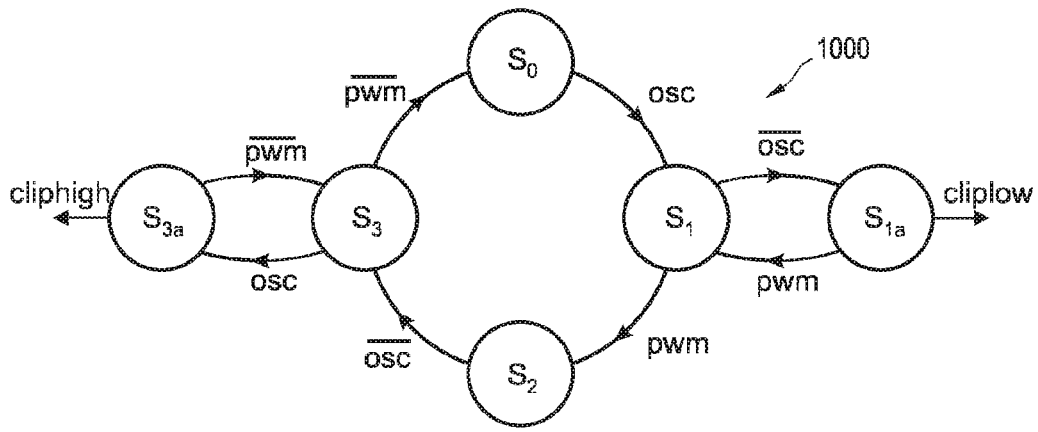
FIG. 10 illustrates a state transition diagram of a clip detection logic according to an exemplary embodiment of the invention.

Particularly, measures may be taken for detecting clipping of one of the integrator units 103, 104 (see FIG. 10).

Class-D amplifiers may use an integrating feedback loop to provide power supply rejection and correction of switching errors in the output stage.

In the following, some considerations regarding conventional systems will be explained. Based on these recognitions, embodiments of the invention have been developed.

Figure 2:
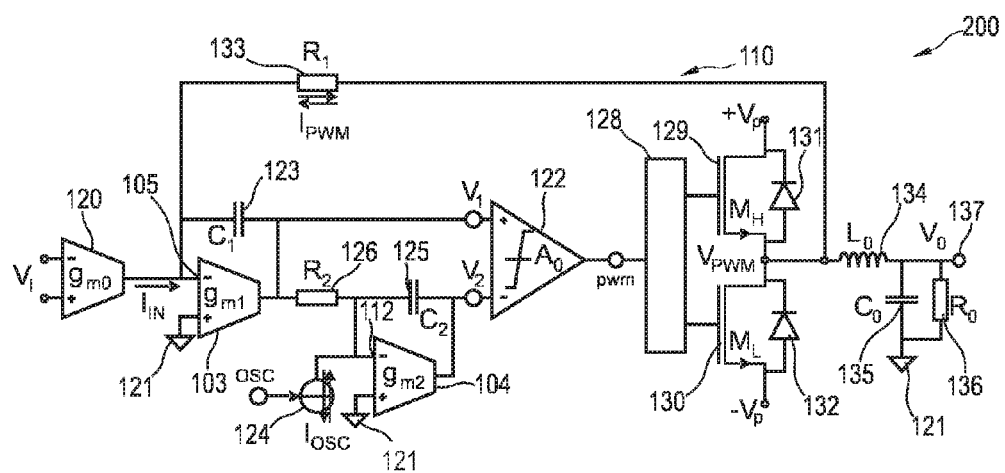
FIG. 2 illustrates a conventional audio data processing device comprising a class-D feedback loop.

An example of a conventional feedback loop system 200 is shown in FIG. 2.

The operation of such a loop system 200 is described in Marco Berkhout, "An Integrated 200-W Class-D Audio Amplifier", IEEE JOURNAL OF SOLID-STATE CIRCUITS, Vol. 38, No. 7, July 2003, pages 1198 to 1206.

Although components of the circuit 100 may be further developed as compared to components of the circuits 200 indicated with the same reference numerals, identical reference numerals have been used for corresponding members in FIG. 1 and FIG. 2 for the sake of clarity.

The loop system 200 has two integrators 103, 104 configured around amplifiers $g_{m1}$ and $g_{m2}$. The output signal $V_{PWM}$ of the amplifier 122, 128 to 132 is a square wave pulse-width modulated (PWM) signal. The load $R_O$ 136 is connected to the amplifier 122, 128 to 132 by means of a low-pass LC-filter 134, 135.

The output voltage $V_{PWM}$ is converted to a current $I_{PWM}$ by feedback resistor $R_1$ 133 and injected into the virtual ground 105 of the first integrator $g_{m1}$ 103. This yields a triangular wave $V_1$ at the output of the first integrator 103. A reference clock signal osc is converted to a square wave current $I_{osc}$ that is injected into the virtual ground of the second integrator $g_{m2}$ 104. This yields a second (reference) triangular wave $V_2$ at the output of the second integrator 104. The triangular wave signals $V_1$ and $V_2$ are fed to the non-inverting and inverting inputs of a comparator $A_0$ 122. When the triangular waves intersect, the comparator output pwm changes state and the output $V_{PWM}$ of the amplifier 122, 128 to 132 switches yielding the desired PWM signal. The peaks of signal $V_2$ coincide with the edges of osc and the peaks of signal $V_1$ coincide with the edges of pwm. The input signal is converted to a current $I_{IN}$ by the voltage-to-current converter $g_{m0}$ 120 and injected into the virtual ground 105 of the first integrator $g_{m1}$ 103.

Figures 3, 4, 5:
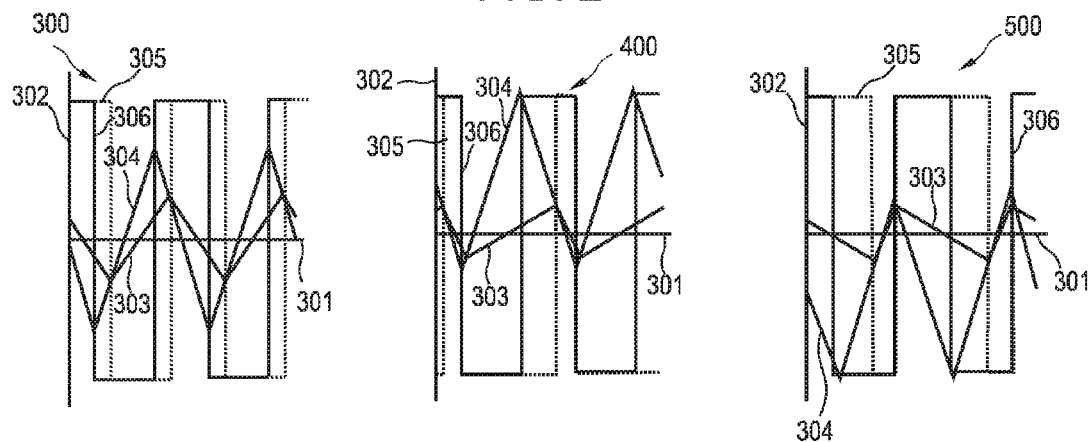
FIG. 3 illustrates integrator signals, an oscillator signal and a comparator output during a zero input signal.
FIG. 4 illustrates integrator signals, an oscillator signal and a comparator output during a negative input signal.
FIG. 5 illustrates integrator signals, an oscillator signal and a comparator output during a positive input signal.

FIG. 3 to FIG. 5 show diagrams 300, 400, 500 which will be explained in the following.

Along an abscissa 301 of the diagrams 300, 400, 500, the time is plotted. Along an ordinate 302 of the diagrams 300, 400, 500, a signal amplitude is plotted.

FIG. 3 shows the triangular wave signals $V_1$ 303 and $V_2$ 304 at zero input yielding a 50% PWM duty cycle. Reference numeral 305 indicates the comparator output signal pwm, and reference numeral 306 indicates the oscillator signal osc.

FIG. 4 shows the same signals 303 to 306 when a negative input signal is applied. The input signal causes the slopes of $V_1$ 303 to change. The shape of $V_2$ 304 remains (almost) the same but the DC-level is shifted with respect to zero. The output signal now has a duty-cycle smaller than 50%.

The opposite happens for a positive input signal as shown in FIG. 5. In this manner a linear relation is realized between the input signal and the duty-cycle of the output signal $V_{PWM}$.

Thus, the duty-cycle of the output signal is limited between 0% and 100%. This also puts a limit on the input signal. If the input signal is increased further the signals $V_1$ 303 and $V_2$ 304 no longer intersect and diverge in opposite directions.

Figure 6:
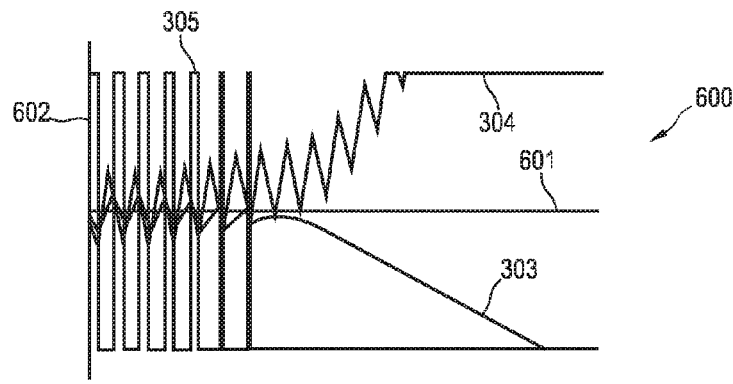
FIG. 6 illustrates integrator signals and a comparator output going from zero signal to negative clipping.

FIG. 6 show a diagram 600 which will be explained in the following.

Along an abscissa 601 of the diagram 600, the time is plotted. Along an ordinate 602 of the diagram 600, a signal amplitude is plotted.

FIG. 6 shows the integrator voltages $V_1$ 303 and $V_2$ 304 for an increasing negative input signal. This situation is called clipping and occurs when the magnitude of the current from the input V-I converter $I_{IN}$ exceeds the magnitude of the current $I_{PWM}$ through the feedback resistor $R_1$ 133.

The output of the amplifiers 103, 104 no longer switches but remains low (or high for a positive input signal) as long as the input signal is too large. In a practical realization, the outputs of the integrators 103, 104 cannot diverge indefinitely but are limited to the supply voltage. Now when the input signal is decreased, the signals $V_1$ 303 and $V_2$ 304 return to normal operation.

Figures 7, 8:
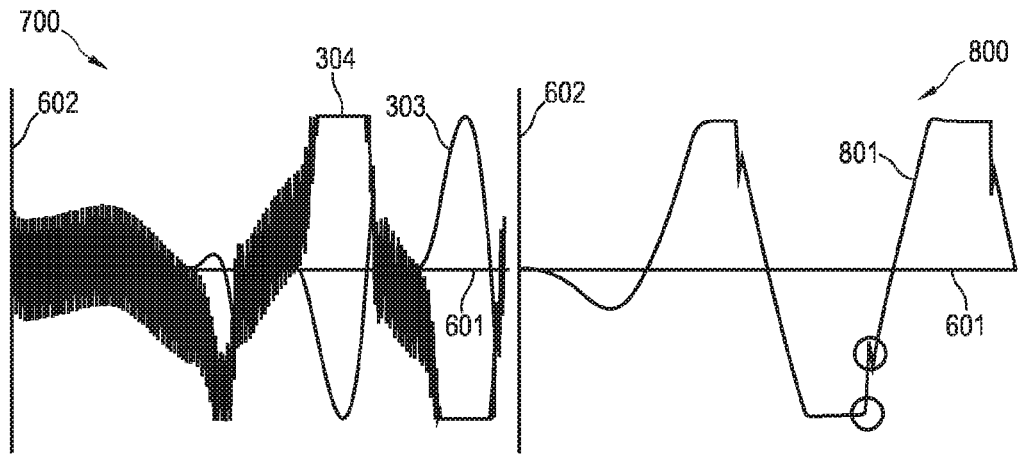
FIG. 7 illustrates a clipping behaviour of integrator outputs.
FIG. 8 illustrates a clipping behaviour of a post-filter output.

However, as can be seen in a diagram 700 of FIG. 7 it takes some time for the signals $V_1$ 303 and $V_2$ 304 to return to steady-state and also the loop needs some time to settle again. This results in typical 'sticking' behavior at the output followed by a second order response as shown in a diagram 800 of FIG. 8 illustrating the signal $V_O$ 801.

One problem is that such clipping recovery behavior may be considered 'ugly' or even audible. A second problem is that when the integrators 103, 104 drift away, the voltage across the capacitors 123, 125 is not controlled and this can be a problem if for example gate-oxide capacitors are used. In this case voltage clamps would be needed to protect the capacitors 123, 125 from damage.

According to an exemplary embodiment of the invention, it may be possible to prevent the integrators 103, 104 in the feedback loop 100 from drifting when the amplifier is clipping. In order to do so, the onset of clipping may be detected and corrective action may be taken to keep the integrators 103, 104 near their steady-state values.

Divergence of the integrators 103, 104 can be avoided by forcing a zero-crossing of the output of each integrator 103, 104 during each clock cycle. As can be seen in FIG. 3 to FIG. 5, both integrators 103, 104 cross zero twice during each clock cycle. During clipping the integrators 103, 104 diverge and do not cross zero anymore as can be seen in FIG. 6. For both integrators 103, 104, a different approach to enforce the zero-crossing may be advantageous.

For the first integrator 103 this can be achieved by injecting a current pulse of appropriate duration in the virtual ground node 105. For the second integrator 104 this can be achieved by manipulating the edges of the reference clock signal osc. This will be explained further in the following.

An essential difference between conventionally resetting an integrator and forcing a zero-crossing according to an embodiment of the invention is that if a reset is used the value of the integrator is destroyed. When a current pulse is applied to force a zero-crossing, the length of the pulse is a direct measure of how much the loop is clipping. This can be exploited to build a clip detection system that indicates the level of distortion caused by the clipping.

Figure 9:
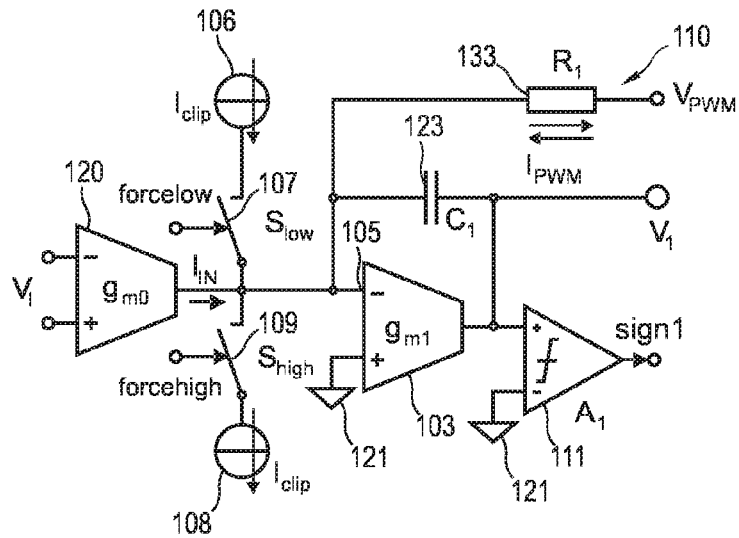
FIG. 9 illustrates forcing zero-crossing of a first integrator according to an exemplary embodiment of the invention.

For the first integrator 103, a zero-crossing may be forced by injecting an appropriate current pulse into the virtual ground 105. This can be done by adding two switched current sources 106, 108 to the virtual ground 105 and a comparator 111 to the output of the first integrator 103 as shown again in FIG. 9.

The switches $S_{low}$ 107 and $S_{high}$ 109 are controlled by signals forcelow and forcehigh, respectively. If for example the loop is clipping to the lowside as shown in FIG. 6, the first integrator 103 diverges towards the negative supply. By closing switch $S_{high}$ 109, a current $I_{clip}$ is drawn from the virtual ground 105 forcing the integrator output $V_E$ up. When comparator $A_1$ 111 detects a zero-crossing, the switch $S_{high}$ 109 may be opened again.

Detection of clipping in the class-D loop 100 is fairly simple. As can be seen in FIG. 3 to FIG. 5, during normal operation a fixed sequence exists in the transitions of the reference clock signal osc and the comparator output signal pwm. A rising edge of the osc signal is always followed by a rising edge of the pwm signal and a falling edge of the osc signal is always followed by a falling edge of the pwm signal (see U.S. Pat. No. 6,577,186 B2).

A deviation from this sequence can be detected by a simple logic circuit 1000. The state transition diagram of such a circuit is shown in FIG. 10.

As long as the signals osc and pwm follow the correct sequence, the circuit cycles through the states $S_0$, $S_1$, $S_2$ and $S_3$. If a transition of the osc signal is followed by an opposite transition of the osc signal instead of the expected transition of the pwm signal, the circuit jumps to state S1a or to state S3a. States S1a and S3a indicate the loop is clipping to the lowside or highside, respectively. In this case the corresponding output signal cliplow or cliphigh goes high. When the loop returns to normal operation, the sequence of the osc and pwm signal may be resumed and the circuit cycles through state $S_0$, $S_1$, $S_2$ and $S_3$ again.

The signals cliplow and cliphigh remain high as long as the clipping continues so they cannot be used to drive the switches $S_{low}$ 107 and $S_{high}$ 109 directly. For a proper control of the switches 107, 109, a logic switch control circuit may be needed that determines when to switch $S_{low}$ 107 and $S_{high}$ 109 on and off again.

Figure 11:
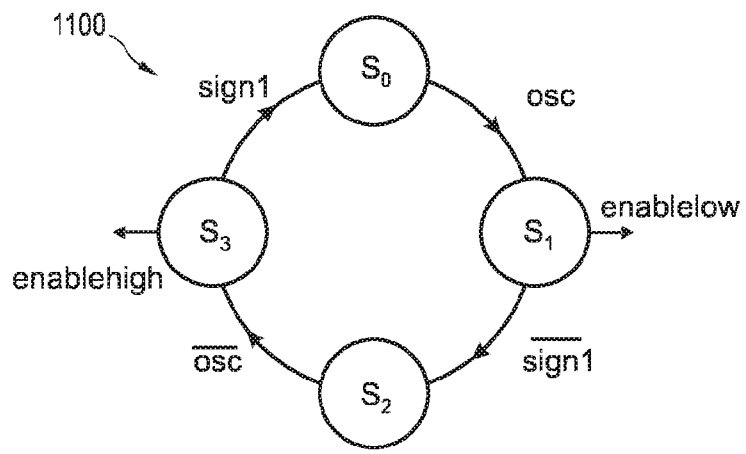
FIG. 11 and FIG. 12 illustrate state transition diagrams of a switch control logic according to an exemplary embodiment of the invention.
Figure 12:
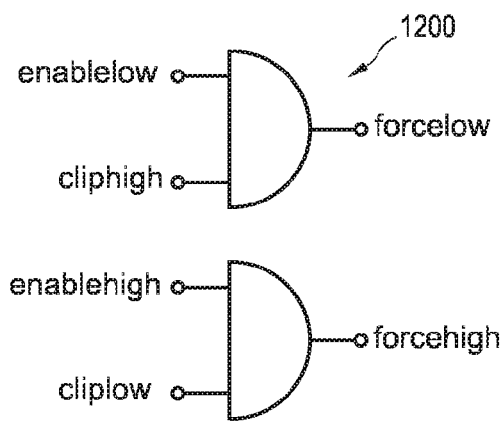

FIG. 11, FIG. 12 show state transition diagrams 1100, 1200 of this switch control logic.

The inputs of the switch control logic are the osc signal, the sign1 signal and the cliplow and cliphigh signals from the clip detection logic from FIG. 10. The outputs are the forcelow and forcehigh signals.

From FIG. 3 to FIG. 5 it can be seen that under non-clipping conditions the output $V_1$ of the first integrator 103 is always positive (sign1=high) during rising edges and negative (sign1=low) during falling edges of the osc signal. When the loop is not clipping, the switch control logic cycles through the states $S_0$, $S_1$, $S_2$ and $S_3$. If for example the loop is clipping negative as shown in FIG. 6, the integrator output $V_1$ remains negative causing the switch control logic to get stuck in state $S_3$ where the output signal enablehigh becomes high. The signal forcehigh is a logic and of signals enablehigh and cliplow.

Consequently switch $S_{high}$ is closed and a current $I_{clip}$ is drawn from the virtual ground 105 of the first integrator 103 forcing the output upwards through zero.

For the second integrator 104, a zero-crossing can be forced by modifying the osc signal.

As can be seen in FIG. 6, the negative peaks of triangular wave $V_2$ stop crossing zero when positive clipping starts. A zero-crossing can be forced when the edge of the osc signal is delayed.

Figure 13:
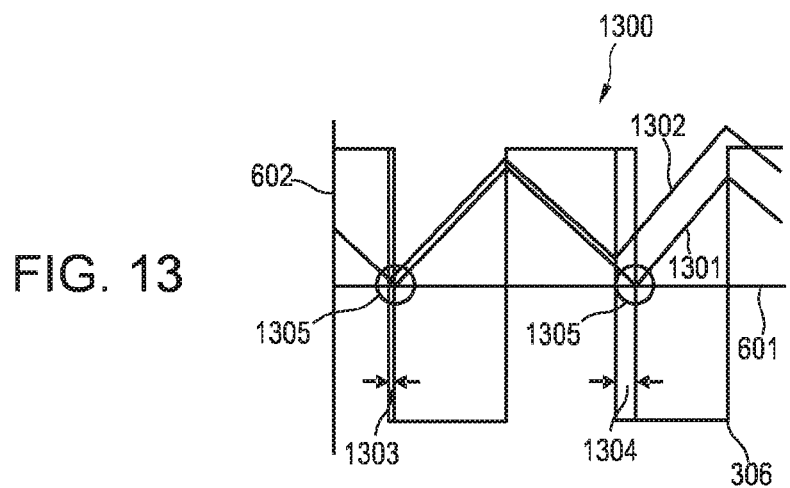
FIG. 13 illustrates an integrator output and an oscillator signal with and without edge delay.

As can be seen in a diagram 1300 of FIG. 13, this causes the falling slope of $V_2$ to become longer until it crosses zero.

More particularly, FIG. 13 shows the output signal of the integrator 104 showing edge delay 1303, 1304 (signal 1301) and no (i.e. without) edge delay (signal 1302). Forced zero-crossing is indicated schematically by reference numeral 1305.

Figure 14:
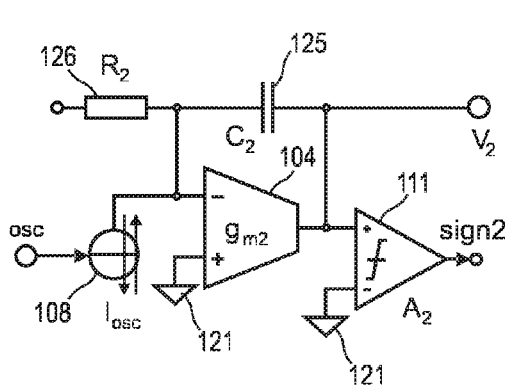
FIG. 14 illustrates detection of zero-crossing of a second integrator according to an exemplary embodiment of the invention.

The zero-crossing 1305 can be detected by a comparator $A_2$ 111 as shown again in FIG. 14.

Figure 15:
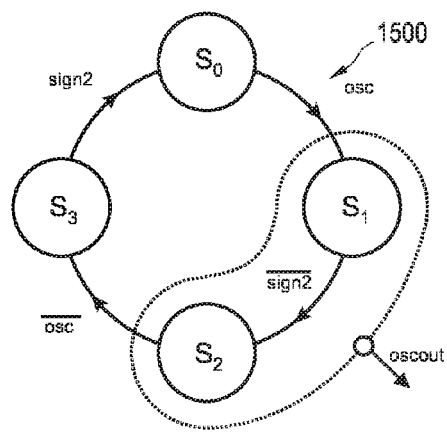
FIG. 15 illustrates a state transition diagram for edge delay logic according to an exemplary embodiment of the invention.

An asynchronous logic circuit can be used to delay the osc edges accordingly. The state transition diagram 1500 of such an asynchronous logic circuit is shown in FIG. 15.

The inputs of the delay logic are the osc signal and sign2 signal. The output is a signal oscout that is high in states $S_1$ and $S_2$ and low in states $S_0$ and $S_3$. The state transition diagram 1500 is identical to that in FIG. 11 but now a different output signal is used.

Under normal operating conditions, the signal $V_T$ is positive (sign2=high) during rising edges and negative (sign2=low) during falling edges of the osc signal. Consequently the edges of the output signal oscout coincide with the edges of the osc signal because the delay logic is always in state $S_0$ during rising edges of and in state $S_2$ during falling edges of osc. Now if for example the integrator output $V_T$ is positive (sign2=high) during a falling edge of the osc signal as is the case in FIG. 11, the delay logic is stuck in state $S_1$. As soon as $V_T$ crosses zero the delay logic jumps to state $S_2$ and then immediately to state $S_3$ thus causing oscout to become low. In this way the falling edge of oscout does not coincide with the falling edge of osc anymore but is delayed until a zero-crossing of $V_T$ is detected.

Figure 16:
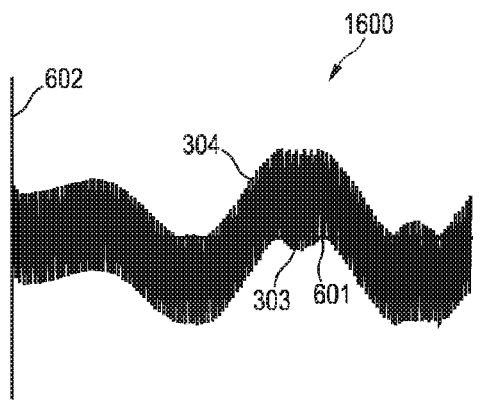
FIG. 16 illustrates an improved clipping behaviour of integrator outputs according to an exemplary embodiment of the invention.
Figure 17:
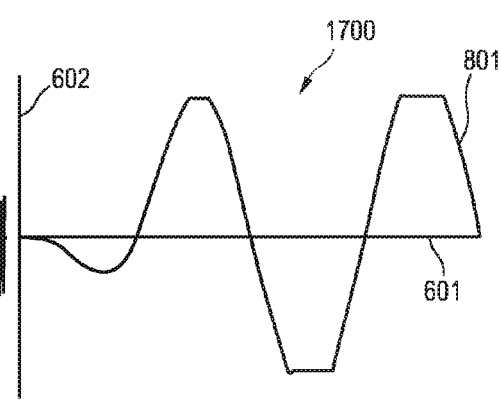
FIG. 17 illustrates an improved clipping behaviour of a post-filter output according to an exemplary embodiment of the invention.

In a diagram 1600 shown in FIG. 16 and in a diagram 1700 shown in FIG. 17 the resulting clipping behavior is shown.

As can be seen, the integrator outputs 303, 304 remain close to zero during clipping and the sticking and second order response in the post-filter output 801 has vanished completely.

Figure 18:
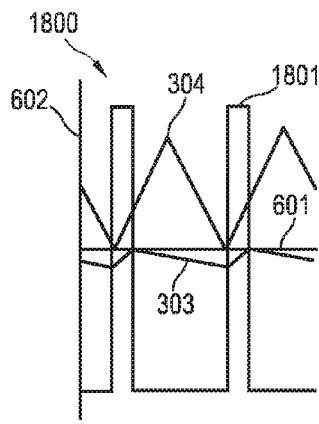
FIG. 18 illustrates a dependence of integrator outputs and a signal forcehigh on an input signal with 20% overdrive.
Figure 19:
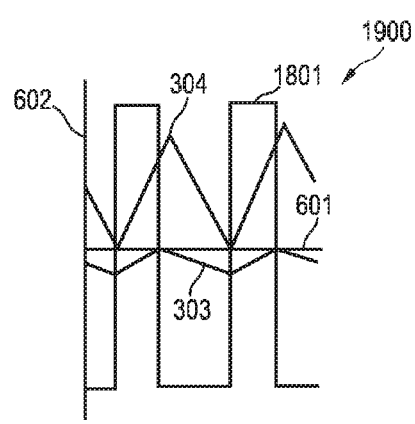
FIG. 19 illustrates a dependence of integrator outputs and a signal forcehigh on an input signal with 40% overdrive.

In a diagram 1800 shown in FIG. 18 and in a diagram 1900 shown in FIG. 19, a close-up shown of the integrator signals 303, 304 and the forcehigh signal 1801 for different values of the input signal. Clearly can be seen that the integrator outputs 303, 304 cross zero during each clock cycle.

In FIG. 18 the input signal is 20% larger and in FIG. 19 the input signal is 40% larger than the clipping limit. As can be seen the duty-cycle of the forcehigh signal 1801 is proportional to the overdrive and can thus be used as a measure of how much the loop is clipping.

Especially in automotive audio systems it may be required that an audio amplifier can indicate when the output signal exceeds a certain distortion level so that the audio DSP in front of the amplifier can adjust the volume accordingly. Such a clip/distortion detection system can made based on duty-cycle measurements on the forcehigh or forcelow signals.

Embodiments of the invention can be applied in integrated class-D audio power amplifiers, for instance in an integrated stereo single-ended class D audio amplifier.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. A device for processing data, the device comprising
an integrator unit configured to integrate an input signal;
a correction unit configured to correct the integrator unit when performing clipping behavior by forcing a zero-crossing of an output signal of the integrator unit; and
a clipping detection unit adapted for detecting the clipping behavior of the integrator unit.

2. The device of claim 1, wherein the correction unit is configured to correct the integrator unit when performing clipping behavior by injecting a current pulse in the integrator unit.

3. The device of claim 2, wherein the correction unit comprises a first switchable current source to be switchably coupled to a virtual ground node of the integrator unit and adapted for forcing the integrator unit up to a zero value when a feedback loop is clipping to a low side.

4. The device of claim 3, wherein the correction unit comprises a second switchable current source to be switchably coupled to the virtual ground node of the integrator unit and adapted for forcing the integrator unit down to the zero value when the feedback loop is clipping to a high side.

5. The device of claim 4, comprising a zero-crossing detector adapted for detecting the zero-crossing of the output signal of the integrator unit and adapted for controlling at least one of the group consisting of the first switchable current source and the second switchable current source in response to the detection of the zero-crossing.

6. The device of claim 1, wherein the correction unit is configured to correct the integrator unit when performing clipping behavior by adjusting a clock signal supplied to the integrator unit.

7. The device of claim 6, wherein the correction unit is configured to correct the integrator unit when performing clipping behavior by delaying an edge of the clock signal supplied to an input of the integrator unit.

8. The device of claim 1, wherein the integrator unit comprises a first integrator and a second integrator and the correction unit comprises a first corrector and a second corrector, wherein the first corrector is configured to correct the first integrator when performing clipping behavior by injecting a current pulse in the first integrator, and wherein the second corrector is configured to correct the second integrator when performing clipping behavior by adjusting a clock signal supplied to the second integrator.

9. The device of claim 8, comprising a signal processing unit adapted for processing an output signal of the first integrator and an output signal of the second integrator to generate a global output signal to be fed back to the first integrator via a feedback loop.

10. The device of claim 1, adapted as at least one of the group consisting of an audio amplifier, a class D amplifier, and an analog to digital converter.

11. The device of claim 1, realized as at least one of the group consisting of an audio surround system, a mobile phone, a headset, a loudspeaker, a hearing aid, a television device, a video recorder, a monitor, a gaming device, a laptop, an audio player, a DVD player, a CD player, a harddisk-based media player, an internet radio device, a public entertainment device, an MP3 player, a hi-fi system, a vehicle entertainment device, a car entertainment device, a medical communication system, a body-worn device, a speech communication device, a home cinema system, a home theater system, a flat television apparatus, an ambiance creation device, a subwoofer, and a music hall system.

12. A method of processing data, the method comprising:
integrating an input signal by an integrator unit;
detecting clipping of the integrator unit;
correcting an integrator unit for which clipping behavior is detected by forcing a zero-crossing of an output signal of the integrator unit;
injecting a current pulse in the integrator unit; and
coupling a first switchable current source to a virtual ground node of the integrator unit and forcing the integrator unit up to a zero value when a feedback loop is clipping to a low side.

13. A program element, which, when being executed by a processor, is adapted to control or carry out a method of claim 12 of processing data.

14. A computer-readable medium, in which a computer program is stored which, when being executed by a processor, is adapted to control or carry out a method of claim 12 of processing data.

15. The method of claim 12, further comprising coupling a second switchable current source to the virtual ground node of the integrator unit and forcing the integrator unit down to the zero value when the feedback loop is clipping to a high side.

16. The method of claim 15, further comprising detecting a zero-crossing of the output signal of the integrator unit and controlling at least one of the group consisting of the first switchable current source and the second switchable current source in response to the detection of the zero-crossing.

17. The method of claim 12, wherein the integrator unit comprises a first integrator unit and a second integrator unit, and the method further comprises correcting the first integrator when performing clipping behavior by injecting a current pulse in the first integrator, and correcting the second integrator when performing clipping behavior by adjusting a clock signal supplied to the second integrator.

18. The method of claim 17, further comprising processing an output signal of the first integrator and an output signal of the second integrator to generate a global output signal to be fed back to the first integrator via a feedback loop.

19. The method of claim 18, further comprising detecting the clipping behavior of the integrator unit.

* * * * *